United States Patent
Duewer et al.

(10) Patent No.: US 7,376,915 B1
(45) Date of Patent: May 20, 2008

(54) METHODS FOR FORMING AREA-EFFICIENT SCAN CHAINS IN INTEGRATED CIRCUITS, AND INTEGRATED CIRCUITS EMBODYING THE SAME

(75) Inventors: Bruce Eliot Duewer, Austin, TX (US); Richard Dean Putman, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 490 days.

(21) Appl. No.: 10/960,258

(22) Filed: Oct. 7, 2004

(51) Int. Cl.
*G06F 17/50* (2006.01)

(52) U.S. Cl. .............................. 716/2; 716/6

(58) Field of Classification Search ............. 716/2, 716/6

See application file for complete search history.

(56) References Cited

U.S. PATENT DOCUMENTS

| | | | |
|---|---|---|---|
| 5,173,906 A * | 12/1992 | Dreibelbis et al. | 714/733 |
| 5,828,579 A * | 10/1998 | Beausang | 716/2 |
| 5,903,466 A * | 5/1999 | Beausang et al. | 716/18 |
| 6,381,715 B1 * | 4/2002 | Bauman et al. | 714/718 |
| 6,671,870 B2 * | 12/2003 | Souef et al. | 716/18 |
| 6,848,068 B1 * | 1/2005 | Liu | 714/733 |
| 2005/0005214 A1 * | 1/2005 | Ueda | 714/726 |
| 2005/0055613 A1 * | 3/2005 | Mitra et al. | 714/726 |
| 2005/0055615 A1 * | 3/2005 | Agashe et al. | 714/727 |

OTHER PUBLICATIONS

Synopsys, How To Avoid MUXs in Front of Scan Segments, https://solvnet.synopsys.com, Synopsys, Inc., 2003.

* cited by examiner

*Primary Examiner*—Stacy Whitmore
(74) *Attorney, Agent, or Firm*—Thompson & Knight LLP; James J. Murphy (57) ABSTRACT

A method of forming a scan chain for testing an integrated circuit includes examining an interconnection of register elements in an integrated circuit design. A register element segment is identified which includes a source register element having an output and a destination register element having an input directly coupled to the output of the source register element. The segment is selectively coupled to another scan register element to form a portion of scan chain.

7 Claims, 12 Drawing Sheets

METHODS FOR FORMING AREA-EFFICIENT SCAN CHAINS IN INTEGRATED CIRCUITS, AND INTEGRATED CIRCUITS EMBODYING THE SAME

FIELD OF INVENTION

The present invention relates in general to scan testing in integrated circuits, and in particular, to methods for forming area-efficient scan chains in integrated circuits, and integrated circuits embodying the same.

BACKGROUND OF INVENTION

Scan testing is an important tool for efficiently testing complex integrated circuits, such as systems-on-a-chip (SOCs), during silicon debug and device production. Generally, scan cells, which typically are one-bit register elements including a multiplexer and a flip-flop, are associated with test-critical nodes of a corresponding circuit block. During normal operation of the chip, the scan flip-flops operate as part of the combinatorial logic as typical register elements. During scan mode, the scan cells of one or more circuit blocks are connected together through their multiplexers to form a scan chain. Each scan chain is essentially a shift register into which an input test vector is shifted serially with a clock signal. Once the scan chain is loaded with the test vector, the individual bits are presented in parallel to corresponding input nodes of the corresponding circuit block under test. Subsequently, a capture operation is performed, in which the resulting bits at corresponding output nodes of the circuit block are clocked in parallel into the scan cells of the scan chain. The resulting output test vector is then shifted out of the scan chain for observation and analysis.

One significant challenge to designing efficient scan chains is minimizing the amount of chip area required for their fabrication. One factor contributing to overall size of the scan elements are the multiplexers, briefly mentioned above. Generally, during normal mode operations, the multiplexer couples the scan cell flip-flop to its normal operating mode source of the corresponding circuit block. In scan mode, the multiplexer couples the scan cell flip-flop to the output of the previous scan cell in the corresponding scan chain. The multiplexer is typically controlled by a scan enable signal, which controls all the multiplexers of the corresponding scan chain, and often, all the multiplexers of all the scan chains on the integrated circuit.

Another significant factor in the design of scan chains is the amount and complexity of the interconnect required to link the scan cells together to form scan chains. Furthermore, some consideration to signal timing is required in scan chain designs, since the multiplexers introduce a small amount of additional signal delay in the operational path.

The chip area, as well as the amount and complexity of the interconnect, required for scan chain fabrication can be significant in complex integrated circuits utilizing thousands of scan cells. While minimizing chip area and interconnections are significant factors in almost any integrated circuit design, these factors nonetheless must be balanced with the competing need to provide scan testing for a sufficient number of critical circuit nodes to insure proper operation of the individual circuit blocks.

Hence new techniques are required for implementing scan testing during the development and production of complex integrated circuits. These techniques should minimize chip area and still provide the requisite number of scan cells on chip necessary to observe each of the critical circuit nodes.

SUMMARY OF INVENTION

The principles of the present invention are embodied in methods for forming integrated circuit scan chains by utilizing existing segments of register elements in the circuit design. According to one particular embodiment, a method is disclosed for forming a scan chain for testing an integrated circuit, which includes examining the interconnection of register elements in an integrated circuit design. A register element segment is identified which includes a source register element having an output and a destination register element having an input directly coupled to the output of the source register element. The segment is selectively coupled to another scan register element to form a portion of scan chain.

The principles of the present invention advantageously provide for a significant reduction in the amount of chip area and interconnections that are required for the fabrication of scan chains in integrated circuits, particularly complex integrated circuits, such as systems-on-a-chip. In particular, by forming scan chains from segments of basic flip-flops, which already operate in serial during normal operation of the corresponding circuit block, the number of the larger scan cells that must be fabricated on-chip is minimized. Specifically, the reduction in the number of scan cells reduces the number of multiplexers, which must be fabricated, thereby saving chip area. Furthermore, the interconnection scheme becomes less complex, since typically flip-flops which are directly interconnected during normal mode operations are located relatively close on the chip.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-5 of the drawings, in which like numbers designate like parts.

For purposes of describing present inventive concepts, a conceptual block diagram of a representative system 100 with scan testing support is shown in FIG. 1. System 100 includes a pair of operational circuit blocks 101a-101b (Block 0 and Block 1) each having a circuit core 102a-102b, consisting of combinational logic and an associated number of test critical I/O terminals or nodes 103. The small number of circuit blocks and I/O terminals shown has been arbitrarily selected for discussion purposes; actual applications will typically be substantially more complex.

Figure 1A:
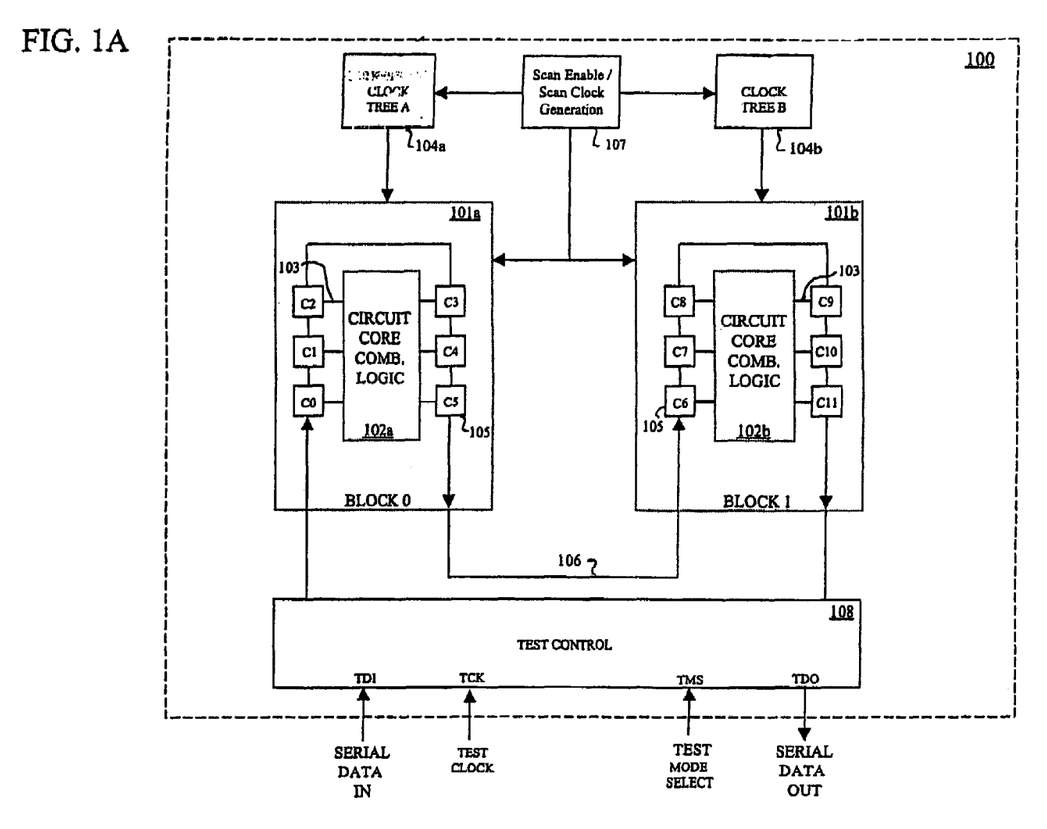
FIG. 1 is a conceptual block diagram of a system-on-a-chip with scan testing support according to the principles of the present invention.

In the illustrated embodiment, system 100 is fabricated on a single integrated circuit chip, although alternate embodiments may be constructed with multiple chips mounted on a support and interconnect structure such as a printed circuit board. For discussion purposes, each operational circuit block 101a-101b is shown with an associated clock tree 104a-104b generating the clocks and sub-clocks required during normal operation of system 100. As will be discussed further below, in selected embodiments of the present concepts, a scan enable signal (SCAN_ENABLE) and/or a set of independent scan clocks, is generated in scan enable-scan clock generation block 107 and drives all scan chains/scan cells in system 100. As shown in FIG. 1A, scan enable-scan clock generation circuitry operates in conjunction with clock trees 104a and 104b.

Each input/output node 103 for the operational circuitry being tested is associated with a scan cell 105 ($C_x$), where x is an arbitrary integer index representing the given scan cell. The scan cells are serially interconnected to create a scan chain, one of which is generally represented by the continuous line 106 extending through scan cells 105 in FIG. 1A. System 100 also includes test control circuitry 108 including an interface having a serial data input and output ports (TDI and TDO), a test clock input (TCK), and a test mode control port (TMS).

While the depicted scan cells 105 are shown electrically adjacent; physically they may be relatively widely spaced apart on system 100. Moreover, the general depiction of the combinatorial logic as blocks 102a and 102b is irrespective of operational block boundaries, as well as sub-clock domain boundaries. For purposes of the present discussion, flip-flops within the same sub-clock domain are those flip-flops that are triggered on the same edge of the same clock signal. For example, for a given clock signal, those flip-flops triggered on the falling edges of that clock signal are in a sub-clock domain, and those flip-flops that are triggered on the rising edges of that clock signal are in another sub-clock domain.

The typical scan cell 105 operates in one of three modes: normal (operational), shift, and capture. In the normal mode, scan cells 105 behave like normal register elements. The shift mode allows a pattern of test bits (i.e., a test vector) to be shifted in serial into the scan chain, for example, scan chain 107. The result bits, generated by the associated logic, are loaded into the scan chain cells 103 in parallel during the capture mode. Then, in shift mode, the results from operations on the test pattern by the logic circuitry are shifted out in serial.

Figure 2:
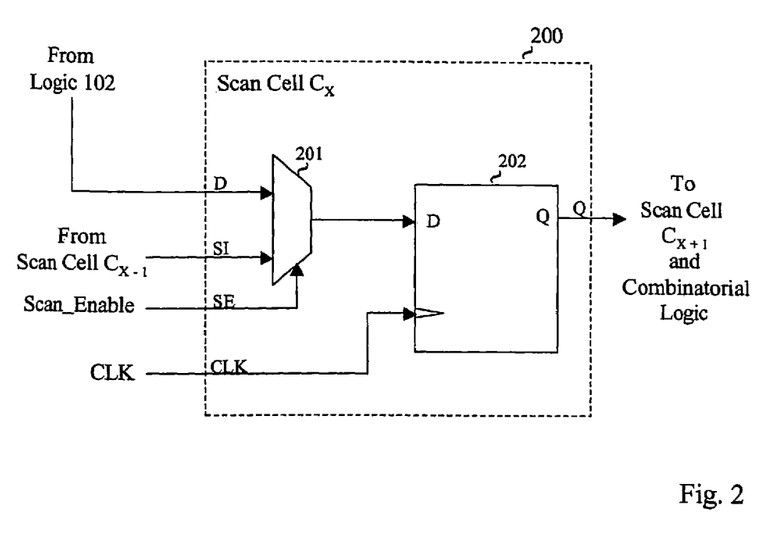
FIG. 2 is a block diagram of an exemplary scan cell.

A selected scan cell 200, representing scan cell $C_X$ in scan chain 106 of FIG. 1, is depicted further in FIG. 2. Scan cell 200 includes a multiplexer 201 and a D-type flip-flop 202. During normal circuit operations, multiplexer 201, under control of the SCAN_ENABLE signal, switches the data bit received at the scan cell D input from the corresponding logic block 102a-102b to the D input of flip-flop 202. The data bit is clocked through to the Q output of flip-flop 202 to the corresponding destination logic of logic block 102a or 102b. Scan mode operation is similar, with the important distinction that multiplexer 201, in response to the SCAN_ENABLE signal, selects scan data from source scan cell $C_{X-1}$ of scan chain 106 and transmits data to the corresponding multiplexer of the destination scan cell $C_{X+1}$.

Figure 3A:
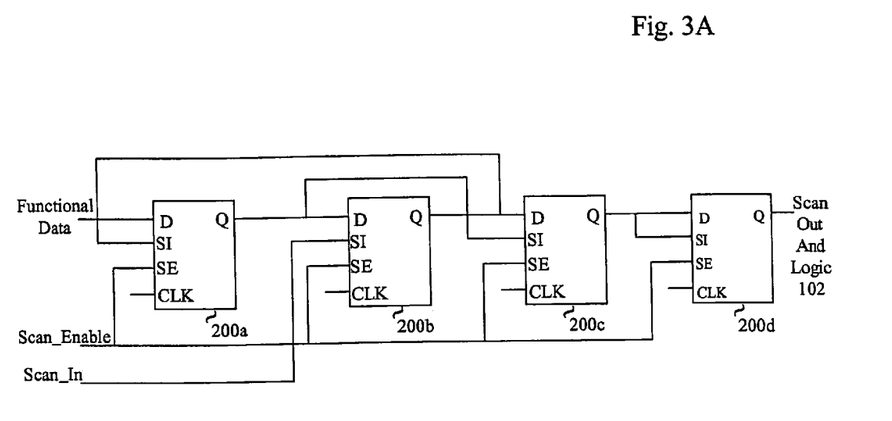
FIG. 3A is a block diagram of a portion of a representative scan chain formed with conventional design and construction techniques.

FIG. 3A illustrates a small portion of a scan chain designed and fabricated utilizing scan cell 200 of FIG. 2 and conventional design techniques. In conventional scan chain insertion techniques, all flip-flops being utilized to create scan chains are grouped by sub-clock domain and converted in the design to scan cells 200. Scan chains are then created by stitching the scan cells 200 within each sub-clock domain together utilizing a simple metric, for example, the alphabetical order of instance names. Scan chains, which cross sub-clock domain boundaries can also be created, typically by utilizing lockup latches at the sub-clock domain boundaries. Some known techniques also take into account the physical locality of the scan cells 200 in order to stitch scan cells 200 together with a minimum of wiring congestion.

Figure 3B:
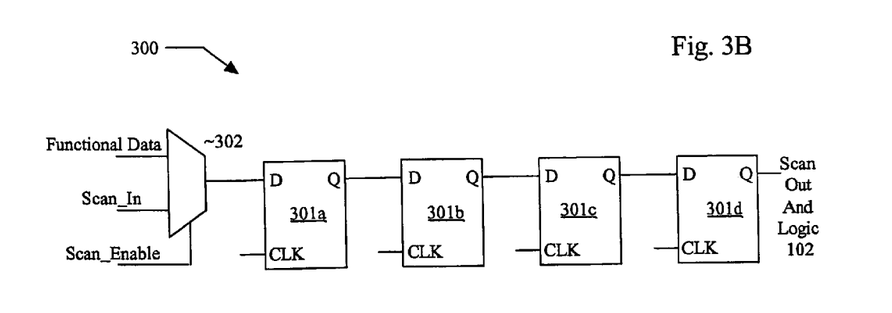
FIG. 3B is a block diagram of a portion of a representative scan chain formed according to the principles of the present invention.

According to the principles of the present invention, smaller basic flip-flops are used in the design and fabrication of on-chip scan chains. FIG. 3B is a block diagram illustrating a small portion of a scan chain 300 utilizing basic D-type flip-flops 301 and embodying the principles of the present invention. Only a single multiplexer 302 is required for each segment of two (2) or more flip-flops 301. Preferred methods for creating scan chains similar to scan chain 300 are discussed below in conjunction with FIGS. 4A-4C and FIGS. 5A-5C.

Advantageously, scan chains, such as scan chain 300, designed and fabricated according to the inventive principles require less area to fabricate than conventional scan chains Additionally, the interconnection routing between scan elements is simplified and the number of connections reduced, in light of conventional techniques. Furthermore, since the present method typically connects flip-flops, which are relatively close together on the chip, the lengths or the necessary connections between scan elements are shortened. Finally, the elimination of at least some of the multiplexers in a given scan chain improves signal timing by reducing signal delays.

Figure 4A:
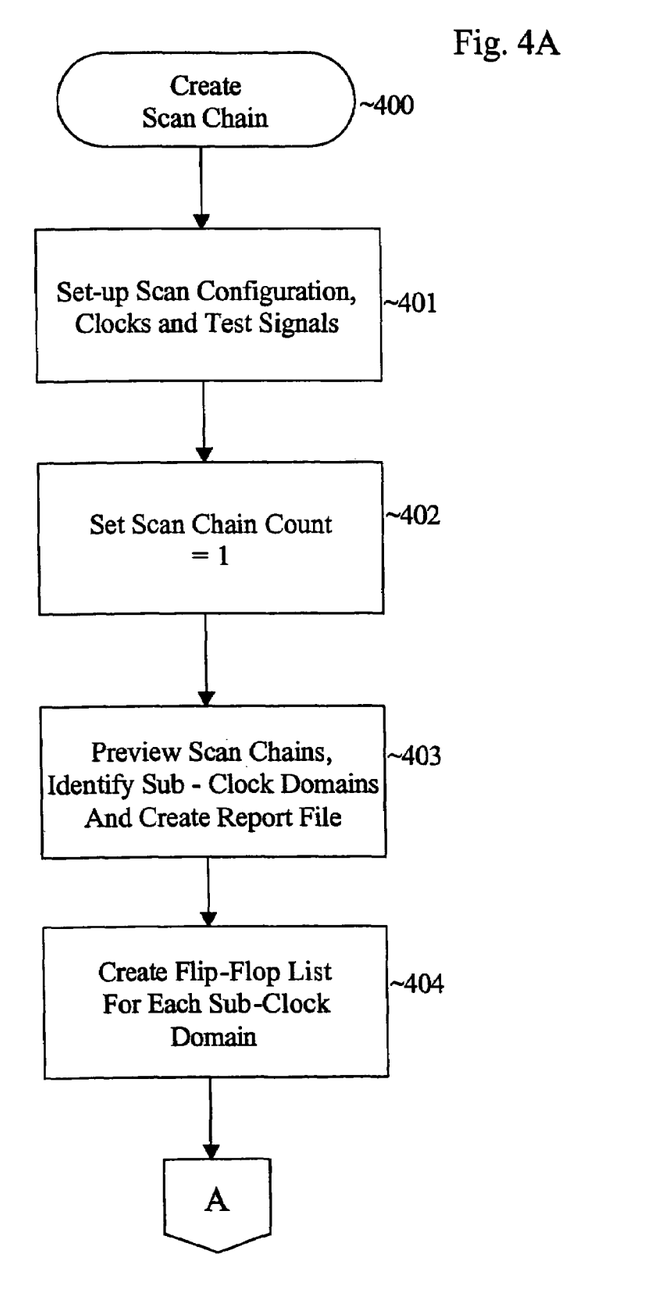
FIGS. 4A-4C are a set of flow charts of an exemplary procedure for inserting a scan chain into an integrated circuit design netlist according to the principles of the present invention.
Figure 4B:
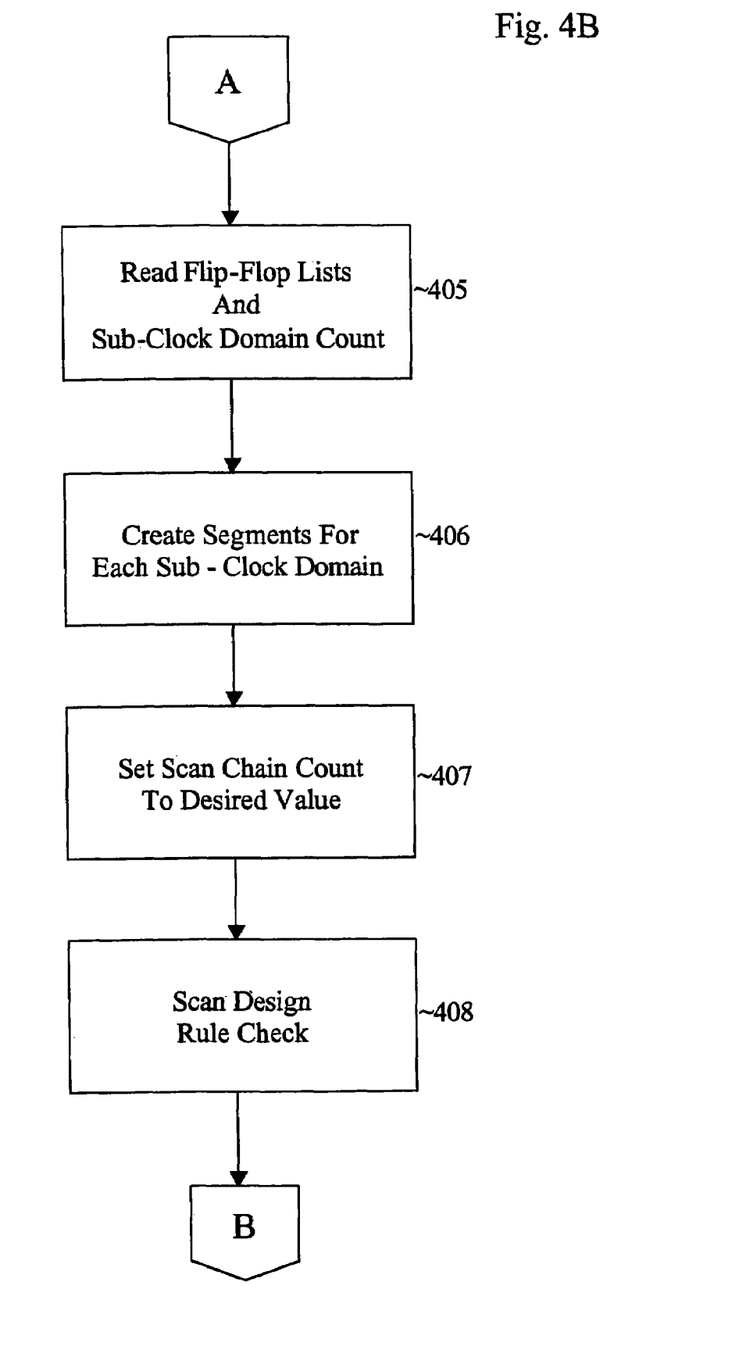
Figure 4C:
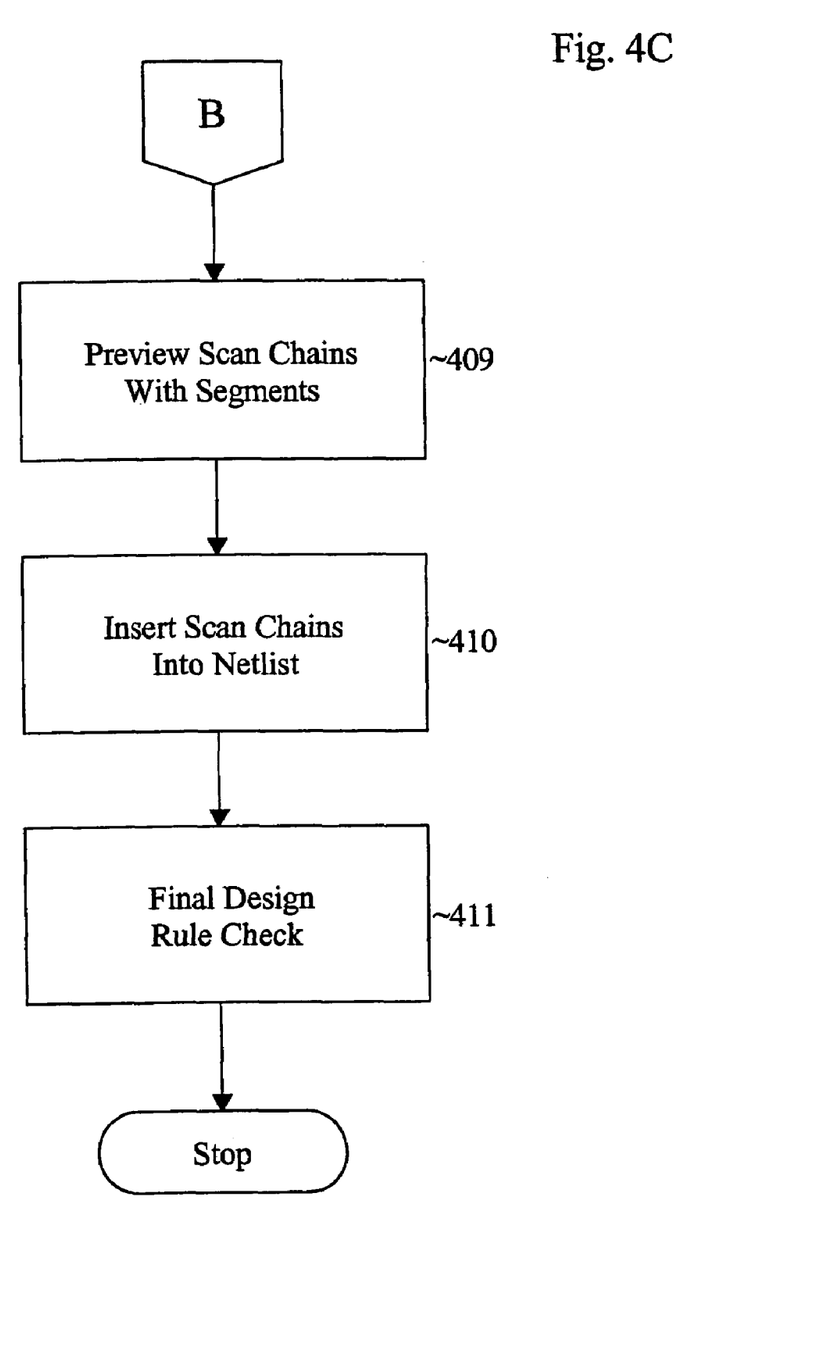

FIGS. 4A-4C describes a representative procedure 400 according to the inventive principles for creating a scan chain for insertion into the design netlist of an integrated circuit. Procedure 400 is embodied in one or more scripts that run in conjunction with a conventional scan chain creation tool, such as the Synopsys Design Compiler/DFT Compiler.

At block 401, the scan chain configuration is set-up, by selecting the required test and clock signal connections. The scan chain count is then set to one (1) at block 402, such that the information being obtained during the following preview of the scan chains is consolidated, as if a single scan chain was being processed.

At block 403, a preview is run to analyze the design netlist. The preview includes an identification of the different sub-clock domains and the flip-flops within each sub-clock domain. From the preview, a report file is generated, from which a flip-flop list is generated for each sub-clock domain, at block 404.

The flip-flop lists and sub-clock domain count are read from the report file at block 405, and flip-flop segments are accordingly generated at block 406 for each sub-clock domain. Flip-flop segment generation is discussed in detail in conjunction with FIGS. 5A-5E. However, generally, an analysis is performed to detect flip-flops within the given sub-clock domain, which are directly connected during normal mode operations of the chip. If certain conditions are met, these flip-flops segments are then added to the scan chains by inserting a multiplexer in front of each segment.

The scan chain count is reset to the actual desired value at block 407 and a design rules check is performed on the scan chains at block 408. At block 409, a preview of the scan chains is performed, and if the subsequent analysis confirms the operability of these scan chains, then they are inserted into the overall integrated circuit netlist at block 410. A final design rules check is performed on the integrated circuit design, with scan chains inserted, at block 411.

A representative procedure 500 for generating flip-flop segments according to the inventive concepts, and suitable for utilization in block 406 of procedure 400 on FIG. 4B, is shown in FIGS. 5A-5F.

Figure 5A:
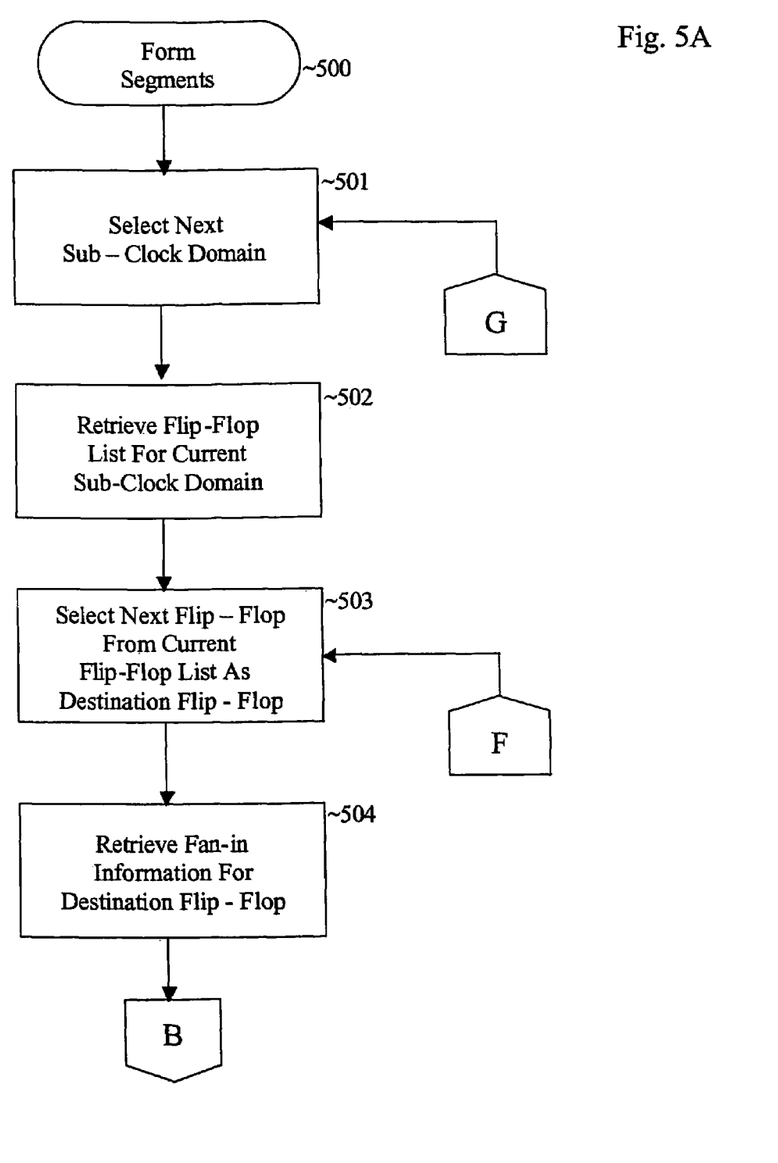
FIGS. 5A-5F are a set of flow charts illustrating in further detail a representative method of generating flip-flop segments in the procedure of FIGS. 4A-4C.

Procedure 500 begins with block 501 on FIG. 5A and the selection of the next sub-clock domain to be analyzed. The flip-flop list for the next sub-clock domain is retrieved at block 502 from the lists created at block 405 of procedure 400 (FIG. 4B). At block 503, the next flip-flop on the current flip-flop list is selected for analysis as the current destination flip-flop.

Analysis of the destination flip-flop selected at block 503 begins at block 504 with retrieval of the fan-in information for that destination flip-flop in the design. This fan-in information is analyzed at decision block 505 of FIG. 5B to determine if the Q output of a current source flip-flop is already connected directly to the D input of the current destination flip-flop, in the netlist before insertion of the scan chain. If not, then procedure 500 jumps forward to decision blocks 506-508 of FIG. 5F.

As discussed below, decision blocks 506-508 close the iteration loops of procedure 500. Specifically, at decision block 506, a determination is made as to whether the current destination flip-flop is the last flip-flop in the current flip-flop list. If it is not, then procedure 500 loops-back to block 503 (FIG. 5A) for the selection of the next destination flip-flop in the current flip-flop list. Otherwise, if the current destination flip-flop is the last flip-flop in the current flip-flop list, at decision block 508, a determination is made as to whether the current sub-clock domain is the last sub-clock domain to be analyzed. If it is not the last sub-clock domain to be analyzed, then procedure 500 loops-back to block 501 (FIG. 5A) and the next sub-clock domain for analysis is selected, otherwise, procedure 500 is complete.

Figure 5B:
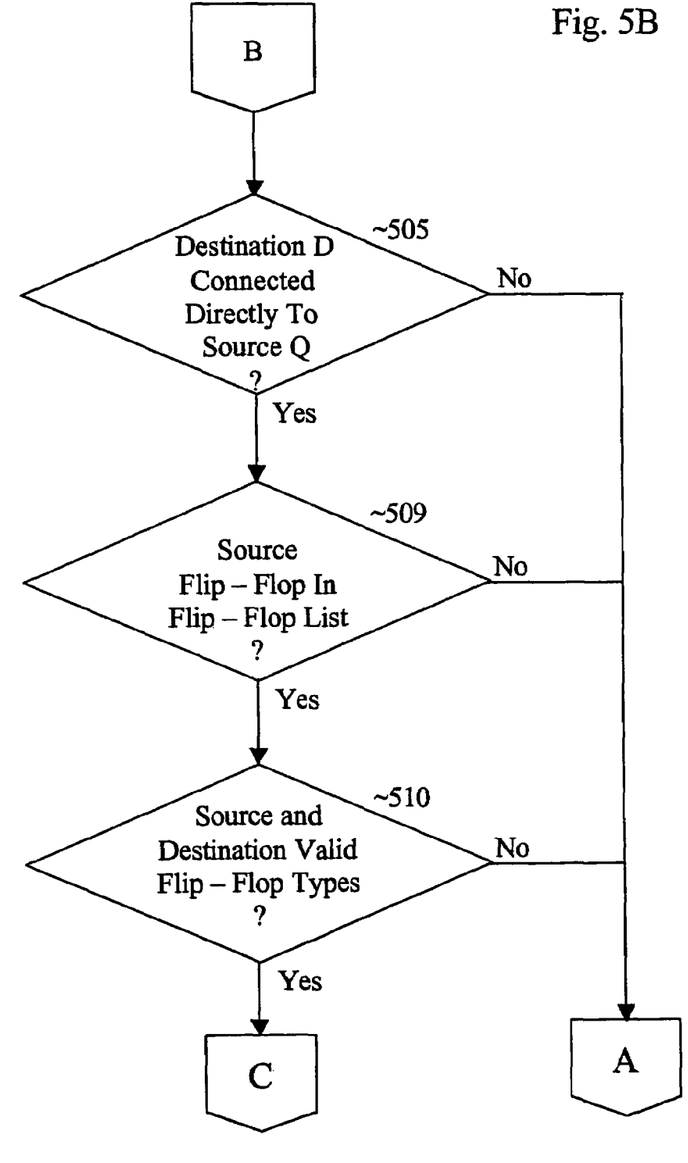

Continuing with block 505 on FIG. 5B, if the D input of the destination flip-flop is directly connected to the Q output of the source flip-flop, then at decision block 509, a further determination is made as to whether the source flip-flop is in the current flip-flop list. If it is not, then procedure 500 again jumps forward to block 506 of FIG. 5F. On the other hand, if the source flip-flip is in the current flip-flop list, then at decision block 510, a determination is made as to whether both the source and destination flip-flops are valid flip-flop types for a scan segment. If the test at block 510 is negative, procedure 500 also jumps to block 506 (FIG. 5F), otherwise, procedure 500 continues to decision block 511 on FIG. 5C.

Figure 5C:
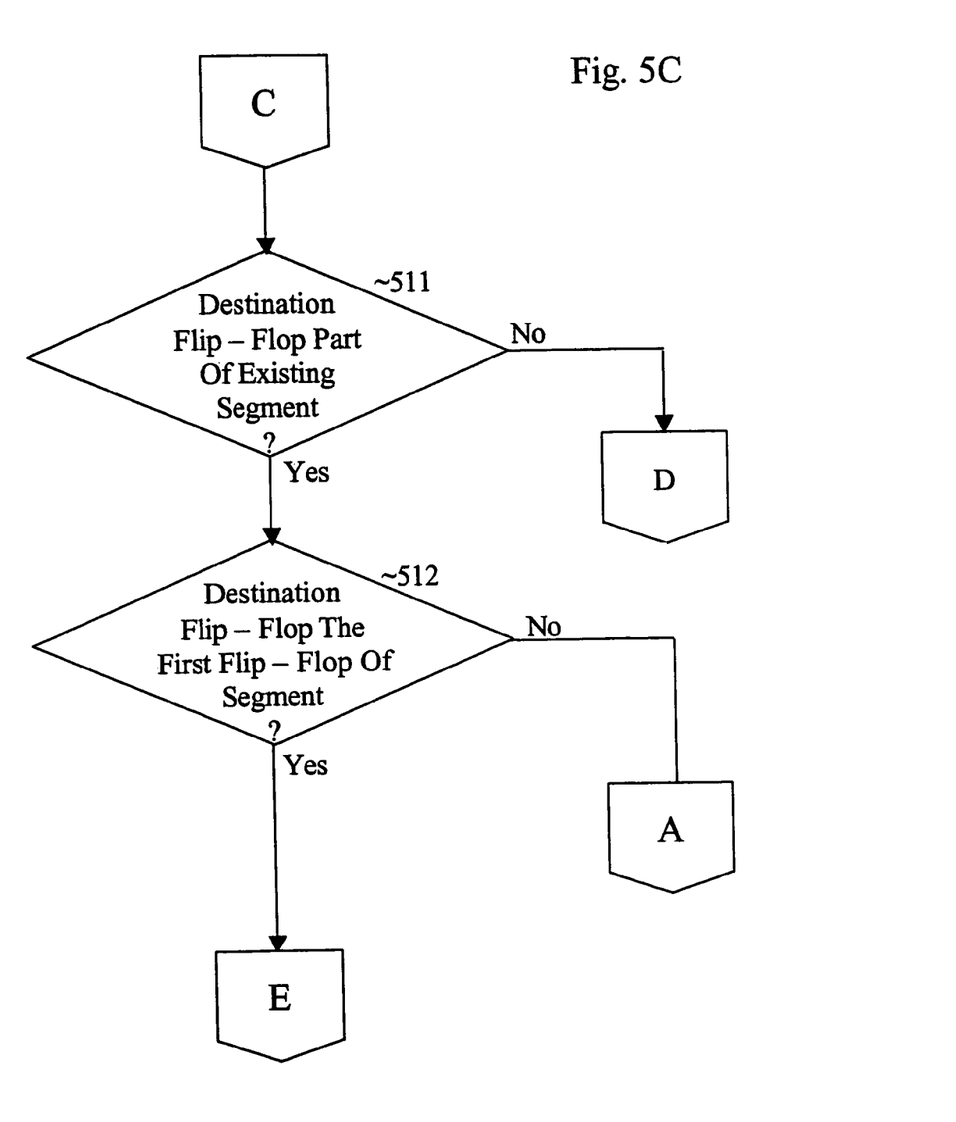

If, at block 511, the destination flip-flop is part of an existing segment and is also the first-flop of that segment, as determined at subsequent decision block 512, then at decision block 513 (FIG. 5E), a determination is made as to whether the source flip-flop is part of an existing segment. If it is not, then at block 514 of FIG. 5E, the source flip-flop is coupled to the destination flip-flop at the beginning of the existing segment, and procedure jumps to block 506 of FIG. 5F. Otherwise, if the source flip-flop is part of an existing segment, at decision block 515, a determination is made as to whether the source flip-flop is the last flip-flop of the existing segment. If it not the last flip-flop in the segment, then procedure 500 again jumps to block 506 of FIG. 5F, otherwise the existing segment including the current source flip-flop and the segment including the destination flip-flop are combined, at block 516, by coupling the Q output of the source flip-flop with the D input of the destination flip-flop. Procedure 500 then jumps to decision block 506 of FIG. 5F. Similarly, if the current flip-flop is not the first flip-flop in the segment, as determined at decision block 512, procedure 500 jumps to decision 506 of FIG. 5F.

Figure 5D:
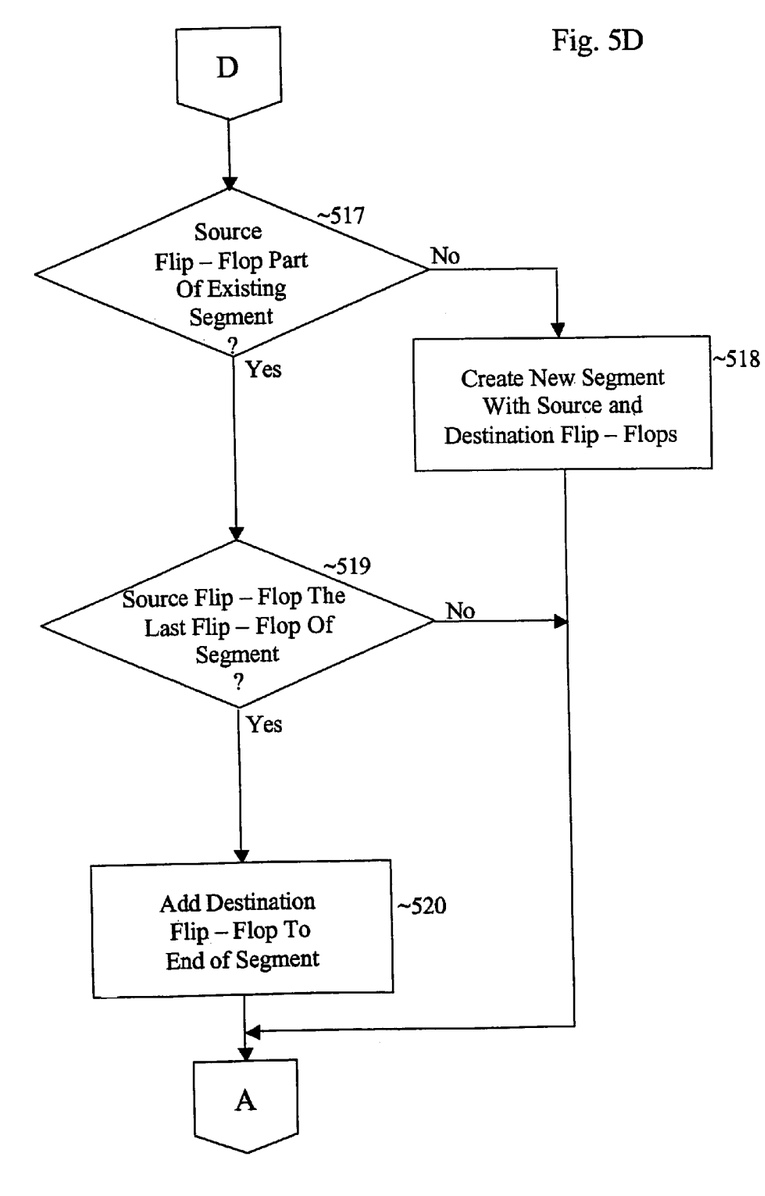
Figure 5E:
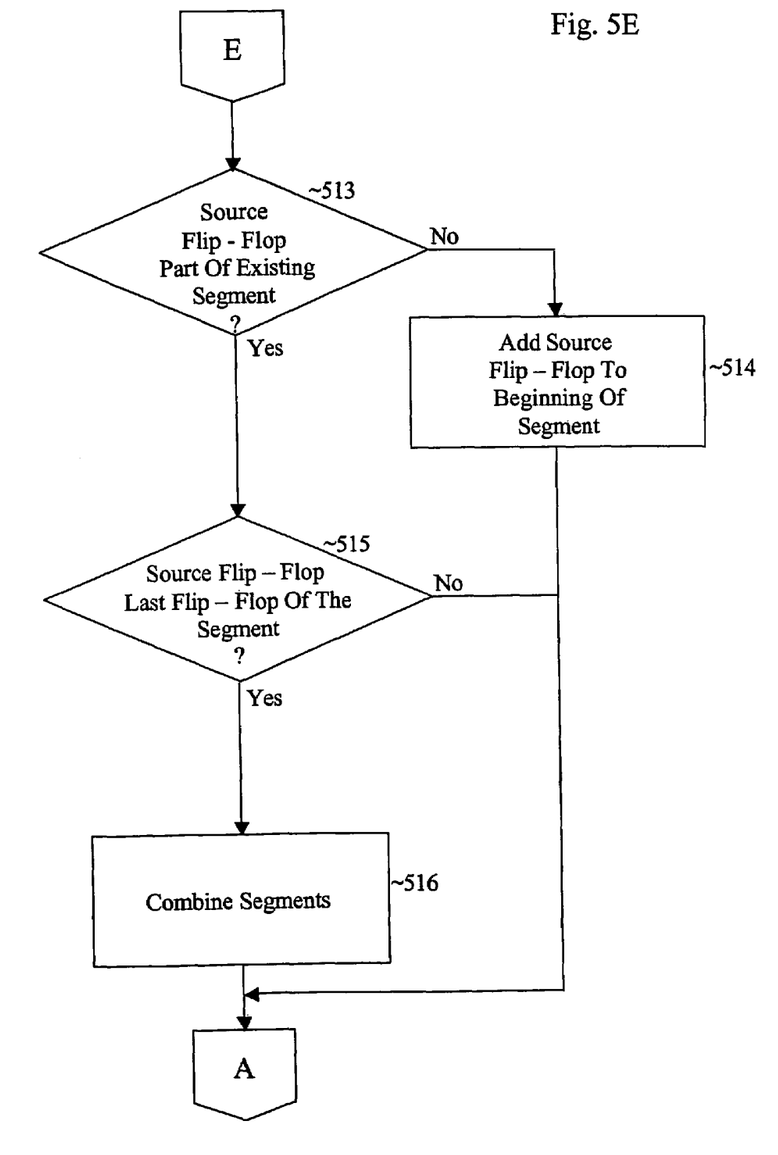
Figure 5F:
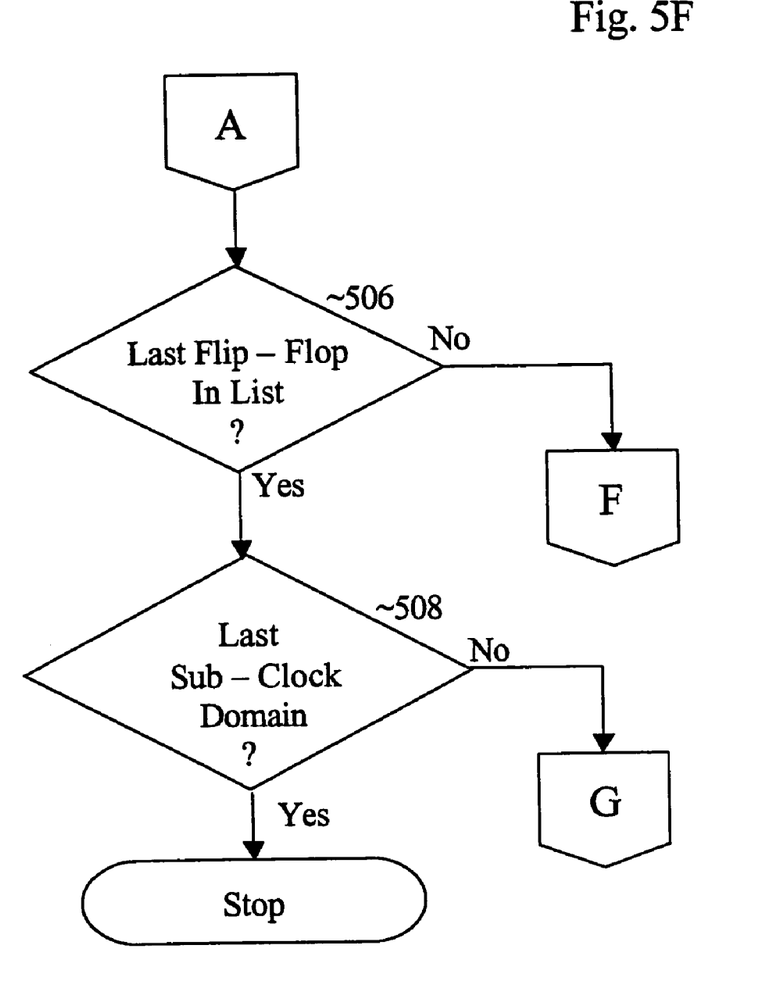

Returning to decision block 511 of FIG. 5C, if a determination is made that the destination flip-flop is not part of an existing segment, then procedure 500 branches to decision block 517 of FIG. 5D. At decision block 517, a determination is made as to whether the source flip-flop is part of an existing segment. If the source flip-flop is not part of an existing segment, then a new segment is formed from the source and destination flip-flops at block 518, and then procedure 500 jumps to decision block 506 of FIG. 5F.

On the other hand, if the current source flip-flop is found to be part of an existing segment at decision block 517, then a further determination is made at decision block 519. Specifically, if at decision block 519 a determination is made that the current source flip-flop is the last flip-flop of the existing segment, then at block 520, a new segment is formed by adding the destination flip-flop to the end of that segment. Otherwise, if the source flip-flop is part of an existing segment, but is not the last flip-flop of that segment, a segment cannot be formed from the current source and destination flip-flops, and therefore procedure 500 jumps to decision block 506 of FIG. 5F.

In other words, the source flip-flop must be either a stand-alone flip-flop or the last flip-flop of an existing segment in order to be suitable for combination with the current destination flip-flop to form a new segment. Similarly, the destination flip-flop must be a stand-alone flip-flop or the first flip-flop of an existing segment in order to be suitable for formation of a new segment.

As described above, procedure 500 iterates through the inner loop starting with block 503 of FIG. 5A and ending with block 506 of FIG. 5F until all flip-flops in the current flip-flop list for the current sub-clock domain have been analyzed. Finally, the outer most loop between block 501 of FIG. 5A and block 508 of FIG. 5F iterates until all sub-clock domains are analyzed, and procedure 500 is completed.

Once the flip-flop segments are created by procedure 500 of FIG. 5, the scan chain insertion procedure of FIG. 4 continues. In particular, once the flip-flop segments are identified, the required multiplexers 302 of FIG. 3B are added in front of each segment as each scan segment is stitched into the associated scan chain. Alternative, the first flip-flop in any segment can automatically be replaced with a full scan cell, such as scan cell 200 of FIG. 2, such that the task of inserting individual multiplexers into the netlist during scan chain stitching is also eliminated.

In sum, according to the principles of the present invention, techniques are provided for creating scan chains utilizing segments of basic flip-flops already found in the integrated circuit netlist. These flip-flop segments are then stitched together to form a scan chain, by either inserting multiplexers at the beginning of each segment and/or by converting the first flip-flop of the segment into a scan cell. The results are a reduction in the area required for scan chain fabrication, smaller and less complicated interconnect, and less delay through the scan chain signal path. Furthermore, these principles can be applied during post processing to parse existing scan chains defined in a netlist, and formed of scan flip-flops, and convert all but the first scan flip-flop in the chain into standard flip-flops without multiplexers.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A computer program embodied in a computer-readable medium for forming a scan chain segment of flip-flops in an integrated circuit design, the computer program when executed on a computer implementing operations comprising:

generating a list of selected flip-flops in an integrated circuit design;

selecting a destination flip-flop from the list of flip-flops;

determining if an input of the destination flip-flop is directly connected to an output of a source flip-flop; and when the input of the destination flip-flop is directly connected to the output of the source flip-flop:

determining if either of the source or destination flip-flops is part of an existing scan chain segment;

if neither of the source or destination flip-flop is part of an existing scan chain segment, forming a scan chain segment with the source and destination flip-flops;

if the destination flip-flop is the first flip-flop of an existing scan chain segment and the source flip-flop not part of an existing segment, combining the source flip-flop and the existing flip-flop segment to form a scan chain segment;

if the destination flip-flop is the first flip-flop of an existing scan chain segment and the source flip-flop is the last flip-flop in another existing scan chain segment, combining the existing scan chain segment and the another scan chain segment to form a scan chain segment; and if the destination flip-flop is not part of an existing scan and the source flip-flop is the last flip-flop of an existing scan chain segment, combining the existing scan chain segment and the destination flip-flop to form a scan chain segment.

2. The computer program of claim 1, further implementing an operation comprising combining first and second scan chain segments to form a portion of the scan chain.

3. The computer program of claim 1, further implementing an operation comprising inserting a multiplexer at an input of a first flip-flop of a selected scan-chain segment.

4. The computer program of claim 1 further implementing an operation comprising determining if the destination and source flip-flops are within the same sub-clock domain if the input of the destination flip-flop is directly connected to the output of the source flip-flop.

5. The computer program of claim 1, wherein the operation of generating a list of selected flip-flops in an integrated circuit design comprises selecting flip-flops from a selected sub-clock domain.

6. The computer program of claim 1, further implementing an operation comprising converting a first flip-flop of a selected scan chain segment into a scan cell.

7. The computer program of claim 1, embodied in a script for operating an automated scan chain development system.

* * * * *